United States Patent
Guo et al.

(10) Patent No.: US 10,790,472 B2
(45) Date of Patent: Sep. 29, 2020

(54) METHOD OF MANUFACTURING A THIN FILM ENCAPSULATION LAYER AND ORGANIC LIGHT EMITTING DIODE DISPLAY DEVICE

(71) Applicant: WUHAN CHINA STAR OPTOELECTRONICS SEMICONDUCTOR DISPLAY TECHNOLOGY CO., LTD., Wuhan, Hubei (CN)

(72) Inventors: Tianfu Guo, Hubei (CN); Hsianglun Hsu, Hubei (CN); Cunjun Xia, Hubei (CN)

(73) Assignee: Wuhan China Star Optoelectronics Semiconductor Display Technology Co., Ltd., Wuhan, Hubei (CN)

( * ) Notice: Subject to any disclaimer, the term of this patent is extended or adjusted under 35 U.S.C. 154(b) by 56 days.

(21) Appl. No.: 16/307,859

(22) PCT Filed: Sep. 7, 2018

(86) PCT No.: PCT/CN2018/104585
§ 371 (c)(1),
(2) Date: Dec. 6, 2018

(87) PCT Pub. No.: WO2020/024366
PCT Pub. Date: Feb. 6, 2020

(65) Prior Publication Data
US 2020/0044195 A1    Feb. 6, 2020

(30) Foreign Application Priority Data
Aug. 3, 2018  (CN) .......................... 2018 1 0876339

(51) Int. Cl.
*H01L 51/52*  (2006.01)
*H01L 51/56*  (2006.01)

(52) U.S. Cl.
CPC ...... *H01L 51/5256* (2013.01); *H01L 51/5237* (2013.01); *H01L 51/5253* (2013.01); *H01L 51/56* (2013.01)

(58) Field of Classification Search
CPC . H01L 51/5256; H01L 51/56; H01L 51/5253; H01L 51/5237
See application file for complete search history.

(56) References Cited

U.S. PATENT DOCUMENTS 8,492,974 B2 *  7/2013  Lee ................... H01L 51/5256
                                                            313/506
9,159,950 B2 * 10/2015  Kim ................... H01L 51/5253
(Continued)

FOREIGN PATENT DOCUMENTS

| CN | 1473284 A | 2/2004 |
| CN | 105428553 A | 3/2016 |

(Continued)

*Primary Examiner* — Bac H Au
(74) *Attorney, Agent, or Firm* — Muncy, Geissler, Olds & Lowe, P.C.

(57) ABSTRACT

A method of manufacturing a thin film encapsulation layer includes providing a substrate provided with an organic light emitting diode (OLED) light emitting device; forming a barrier layer on the substrate, wherein the barrier layer surrounds the OLED light emitting device and includes an organic material having hydrophobic properties; forming a first inorganic encapsulation layer on the substrate, wherein the first encapsulation layer covers the OLED light emitting device; and removing the barrier layer.

20 Claims, 4 Drawing Sheets

(56) References Cited

U.S. PATENT DOCUMENTS

| | | |
|---|---|---|
| 9,716,249 B2 * | 7/2017 | Ho .................. H01L 27/3244 |
| 9,761,837 B2 * | 9/2017 | Zhang ............... H01L 27/3244 |
| 2003/0143845 A1 | 7/2003 | Mori et al. |
| 2007/0077849 A1 | 4/2007 | Chen et al. |
| 2015/0171369 A1 * | 6/2015 | Xie .................. H01L 51/5256 |
| | | 257/40 |
| 2016/0035998 A1 * | 2/2016 | Hahm ................ H01L 51/102 |
| | | 257/40 |
| 2017/0084869 A1 * | 3/2017 | Wang ............... H01L 51/5256 |
| 2017/0279080 A1 * | 9/2017 | Wang ............... H01L 51/5256 |
| 2018/0212187 A1 | 7/2018 | Jin |
| 2018/0363135 A1 | 12/2018 | Huang |

FOREIGN PATENT DOCUMENTS

| | | |
|---|---|---|
| CN | 106711354 A | 5/2017 |
| CN | 107403877 A | 11/2017 |
| CN | 108183179 A | 6/2018 |
| CN | 108305954 A | 7/2018 |

* cited by examiner

METHOD OF MANUFACTURING A THIN FILM ENCAPSULATION LAYER AND ORGANIC LIGHT EMITTING DIODE DISPLAY DEVICE

FIELD OF INVENTION

The present disclosure relates to the field of display technologies, and more particularly to a method of manufacturing a thin film encapsulation layer and an organic light emitting diode (OLED) display device.

BACKGROUND OF INVENTION

Organic light emitting diode (OLED) display devices are current-type semiconductor light emitting devices, which have advantages of light weight, wide viewing angle, fast response time, low temperature resistance, high luminous efficiency, etc. and have been widely used in the field of illumination and display compared with conventional liquid crystal display devices. The OLED display device emits light using an internal OLED component, and the OLED component is sensitive to external factors such as water and oxygen. Therefore, corrosion of water and oxygen causes a decrease in stability and service life of the OLED component.

At present, in thin film encapsulation technology, one better method is a method in which an organic encapsulation layer and an inorganic encapsulation layer are alternately laminated. The inorganic encapsulation layer is required to have excellent water and oxygen resistance, and the organic encapsulation layer is configured to relieve stress on the inorganic encapsulation layer during bending. The inorganic encapsulation layer is usually formed using atomic layer deposition, and the organic encapsulation layer is mainly formed using an inkjet printing method. Atomic layer deposition technology is a means of forming a deposited film by alternately passing gas phase precursor pulses into a reactor and performing a chemical adsorption reaction on a surface of a deposited substrate. The atomic layer deposition has advantages of uniform thickness, good compactness, and no pinholes, etc. However, in deposition process of the inorganic film layer in a specified region using photomask process, there is also deposition of the inorganic film layer under a mask region, that is, the deposition of the inorganic layer is also performed in an unspecified region, and the inorganic layer formed using the atomic layer deposition method is difficult to clean, and cost of the photomask process is high.

In summary, currently inorganic encapsulation layer uses the photomask process to achieve deposition of the inorganic film layer in the specified area, the cost of the photomask process is high, and the inorganic film formed using the atomic layer deposition is difficult to be completely cleaned, this increases difficulty of the photomask process.

SUMMARY OF INVENTION

The present disclosure provides a method of manufacturing a thin film encapsulation layer, so as to solve current manufacturing method, in which an inorganic film layer is deposited in other unspecified areas due to a photomask process, and the inorganic film layer is difficult to be cleaned, thereby affecting display performance.

In order to solve the above technical problems, the technical solution provided by the present disclosure is as follows.

To achieve the above object, an embodiment of the present disclosure provides a method of manufacturing a thin film encapsulation layer including:

a step S10 of providing a substrate provided with an organic light emitting diode (OLED) light emitting device;

a step S20 of forming a barrier layer on the substrate, wherein the barrier layer surrounds the OLED light emitting device and includes an organic material having hydrophobic properties;

a step S30 of forming a first inorganic encapsulation layer on the substrate, wherein the first encapsulation layer covers the OLED light emitting device;

a step S40 of removing the barrier layer;

a step S50 of forming an organic encapsulation layer on a surface of the first inorganic encapsulation layer; and a step S60 of forming a second inorganic encapsulation layer on a surface of the organic encapsulation layer, wherein the second inorganic encapsulation layer covers the first inorganic encapsulation layer and the organic encapsulation layer.

In an embodiment of the present disclosure, the method further includes, before the step S30, performing a hydrophobic plasma treatment to a surface of the barrier layer for enhancing hydrophobic properties of the barrier layer.

In an embodiment of the present disclosure, the step S40 includes cleaning the substrate provided with the first inorganic encapsulation layer using a plasma cleaning machine to remove the barrier layer.

In an embodiment of the present disclosure, the step S40 includes cleaning the substrate provided with the first inorganic encapsulation layer using an organic solution or an acidic solution to remove the barrier layer.

In an embodiment of the present disclosure, a thickness of the barrier layer is less than 2 μm.

In an embodiment of the present disclosure, the barrier layer is made using a screen printing or a spot coating process.

In an embodiment of the present disclosure, the step S30 includes:

a step S301 of attaching a first precursor to a surface of the substrate;

a step S302 of purging the surface of the substrate with an inert gas or nitrogen;

a step S303 of attaching a second precursor to the surface of the substrate, such that the first precursor and the second precursor react to form a thin film layer;

a step S304 of purging the surface of the substrate with the inert gas or the nitrogen; and a step S305 of repeating the steps S301 to S303 to form the first inorganic encapsulation layer having a predetermined thickness on the surface of the substrate.

In an embodiment of the present disclosure, the first precursor is water vapor, and the second precursor is trimethylaluminum.

An embodiment of the present disclosure further provides an organic light emitting diode (OLED) display device. The OLED display device includes a substrate provided with an OLED light emitting device and a thin film encapsulation layer. A method of manufacturing the thin film encapsulation layer includes:

a step S10 of forming a barrier layer on the substrate, wherein the barrier layer surrounds the OLED light emitting device and includes an organic material having hydrophobic properties;

a step S20 of forming a first inorganic encapsulation layer on the substrate, wherein the first encapsulation layer covers the OLED light emitting device;

a step S30 of removing the barrier layer;

a step S40 of forming an organic encapsulation layer on a surface of the first inorganic encapsulation layer; and a step S50 of forming a second inorganic encapsulation layer on a surface of the organic encapsulation layer, wherein the second inorganic encapsulation layer covers the first inorganic encapsulation layer and the organic encapsulation layer.

An embodiment of the present disclosure further provides a method of manufacturing a thin film encapsulation layer including:

a step S10 of providing a substrate provided with an organic light emitting diode (OLED) light emitting device;

a step S20 of forming a barrier layer on the substrate, wherein the barrier layer surrounds the OLED light emitting device and includes an organic material having hydrophobic properties;

a step S30 of forming a first inorganic encapsulation layer on the substrate, wherein the first encapsulation layer covers the OLED light emitting device; and a step S40 of removing the barrier layer.

In an embodiment of the present disclosure, the method further includes, before the step S30, performing a hydrophobic plasma treatment to a surface of the barrier layer for enhancing hydrophobic properties of the barrier layer.

In an embodiment of the present disclosure, the step S40 includes cleaning the substrate provided with the first inorganic encapsulation layer using a plasma cleaning machine to remove the barrier layer.

In an embodiment of the present disclosure, the step S40 includes cleaning the substrate provided with the first inorganic encapsulation layer using an organic solution or an acidic solution to remove the barrier layer.

In an embodiment of the present disclosure, a thickness of the barrier layer is less than 2 μm.

In an embodiment of the present disclosure, the barrier layer is made using a screen printing or a spot coating process.

In an embodiment of the present disclosure, the step S30 includes:

a step S301 of attaching a first precursor to a surface of the substrate;

a step S302 of purging the surface of the substrate with an inert gas or nitrogen;

a step S303 of attaching a second precursor to the surface of the substrate, such that the first precursor and the second precursor react to form a thin film layer;

a step S304 of purging the surface of the substrate with the inert gas or the nitrogen; and a step S305 of repeating the steps S301 to S303 to form the first inorganic encapsulation layer having a predetermined thickness on the surface of the substrate.

In an embodiment of the present disclosure, the first precursor is water vapor, and the second precursor is trimethylaluminum.

The present disclosure has beneficial effects that the inorganic film layer deposited in the designated area by providing the barrier layer, thereby avoiding the use of the photomask process and saving cost.

DESCRIPTION OF DRAWINGS

The accompanying figures to be used in description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
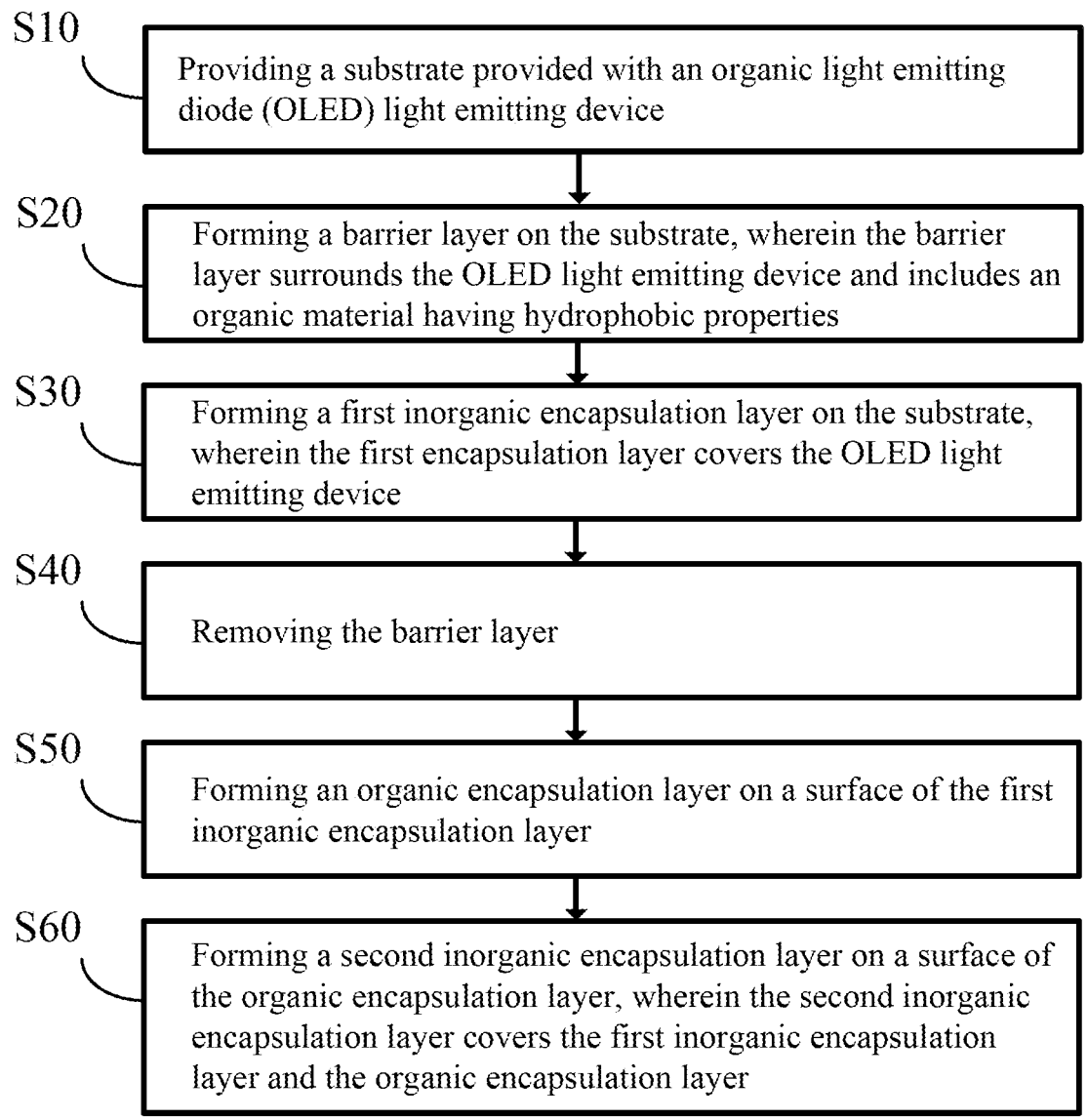
FIG. 1 is a flowchart illustrating steps of a method of manufacturing a thin film encapsulation layer according to embodiment 1 of the present disclosure.

The embodiments described herein with reference to the accompanying drawings are explanatory, illustrative, and used to generally understand the present disclosure. Furthermore, directional terms described by the present disclosure, such as top, bottom, front, back, left, right, inner, outer, side, etc., are only directions by referring to the accompanying drawings, and thus the used terms are used only for the purpose of describing embodiments of the present disclosure and are not intended to be limiting of the present disclosure. In the drawings, modules with similar structures are labeled with the same reference number.

The present disclosure addresses technical problems of current thin film packaging method and solves the drawbacks, in which a current process of manufacturing an inorganic encapsulation layer using atomic layer deposition uses a photomask process, such that an inorganic film layer is deposited in a specified region, and the inorganic film layer deposited in an unspecified area is difficult to completely remove, which increases difficulty of the photomask process and affects the technical problems of package Refer to FIG. 1, an embodiment of the present disclosure provides a method of manufacturing a thin film encapsulation layer including the following steps.

Step S10 of providing a substrate provided with an organic light emitting diode (OLED) light emitting device is provided.

Figure 2:
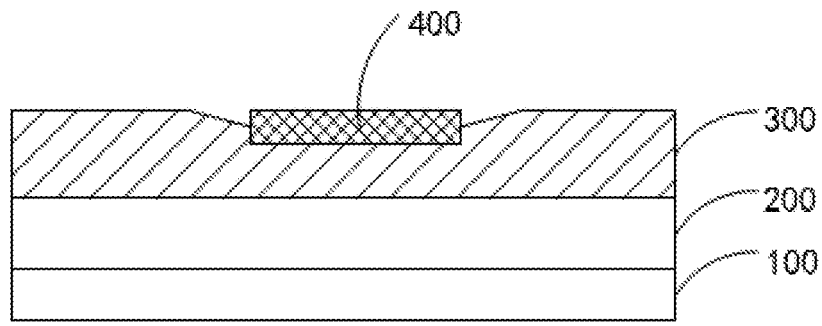
FIG. 2 is a schematic view illustrating a process of manufacturing a thin film encapsulation layer according to embodiment 1 of the present disclosure.

Refer to FIG. 2, a schematic view of a substrate of an embodiment is provided. The substrate includes a substrate 100, a thin film transistor layer 200, a pixel defining layer 300, and an OLED light emitting device 400.

First, the thin film transistor layer 200 is formed on the substrate 100. The substrate 100 is a glass substrate, and may be a flexible substrate such as polyimide (PI).

The thin film transistor layer 200 includes an array substrate, a source, a drain, and an insulating layer.

Then, the pixel defining layer 300 is formed on the thin film transistor layer 200. The pixel defining layer 300 is provided with a contact hole.

Finally, the OLED light emitting device 400 is formed on the pixel defining layer 300.

The OLED light emitting device 400 includes an anode, a hole injection layer, a hole transport layer, a light emitting layer, an electron transport layer, an electron injection layer, and a cathode disposed in sequence.

The anode is electrically connected to the source or the drain of the thin film transistor layer 200 through the contact hole of the pixel defining layer 300, and the contact hole is used to receive a part of a structural layer of the OLED light emitting device 400, such as the light emitting layer.

Step S20 of forming a barrier layer on the substrate is provided. The barrier layer surrounds the OLED light emitting device and includes an organic material having hydrophobic properties.

Figure 3:
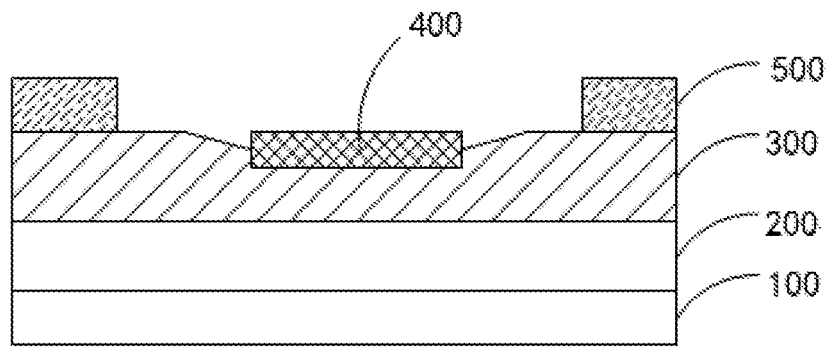
FIG. 3 is a schematic view illustrating a process of manufacturing a thin film encapsulation layer according to embodiment 1 of the present disclosure.

Refer to FIG. 3, a cross-sectional view of a barrier layer in a process of manufacturing a thin film encapsulation layer is provided. In details, a barrier layer 500 is deposited on the pixel defining layer 300, and the barrier layer 500 is formed in an area where an inorganic film layer is not required to be deposited.

Figure 4:
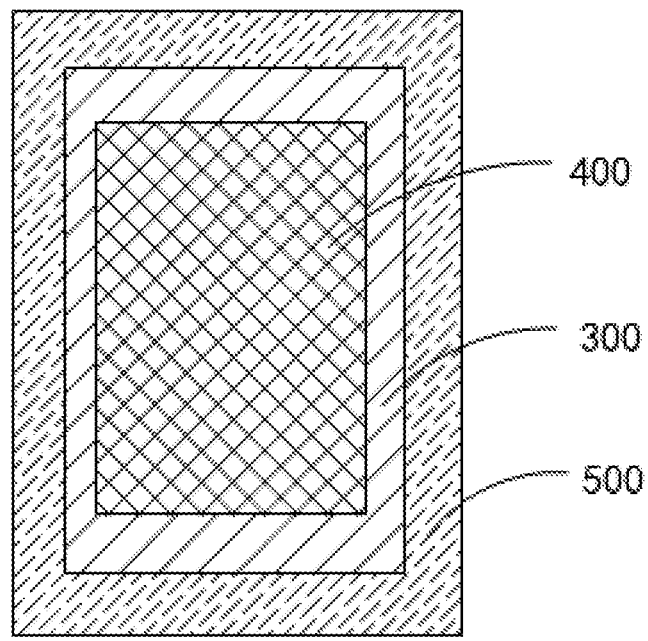
FIG. 4 is a schematic view illustrating a process of manufacturing a thin film encapsulation layer according to embodiment 1 of the present disclosure.

Refer to FIG. 4, a top view of the barrier layer in the process of manufacturing the thin film encapsulation layer of the embodiment is provided. The barrier layer 500 is a closed structure, and the barrier layer 500 is disposed around the OLED light emitting device 400.

The barrier layer 500 is made using an organic compound having extremely strong hydrophobic properties. The barrier layer 500 in the embodiment is made using a polyethylene material, and can also be made using a polyalkyl compound.

The barrier layer 500 is made using a screen printing or a spot coating process, such that the polyethylene material of the barrier layer 500 is deposited on a surface of the pixel defining layer 300. A thickness of the barrier layer is less than 2 micrometers.

The barrier layer 500 can replace a conventional photomask process. Since the barrier layer 500 has extremely strong hydrophobic properties, a subsequent inorganic film layer cannot be deposited on a surface of the barrier layer 500. Further, deposition of the inorganic film layer in a specified region is achieved.

After the barrier layer 500 is coated on the surface of the substrate, the entire structural layer is placed in an atmospheric plasma cleaner chamber, and the barrier layer 500 is subjected to surface hydrophobic treatment to further enhance hydrophobic properties of the barrier layer 500.

Step S30 of forming a first inorganic encapsulation layer on the substrate is provided. The first encapsulation layer covers the OLED light emitting device.

The first inorganic encapsulation layer 600 in the embodiment is formed using atomic layer deposition.

Figure 5:
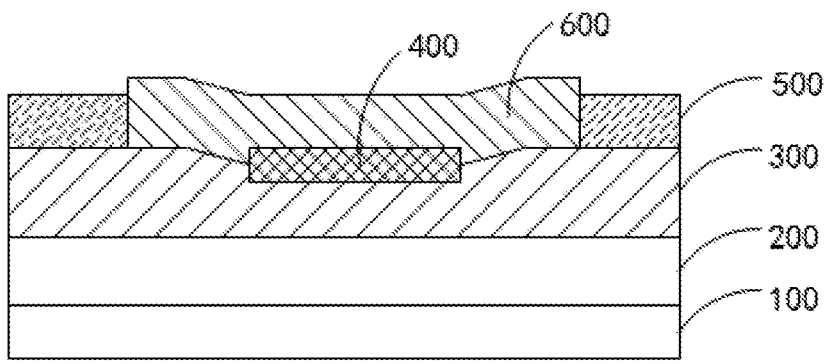
FIG. 5 is a schematic view illustrating a process of manufacturing a thin film encapsulation layer according to embodiment 1 of the present disclosure.
Figure 6:
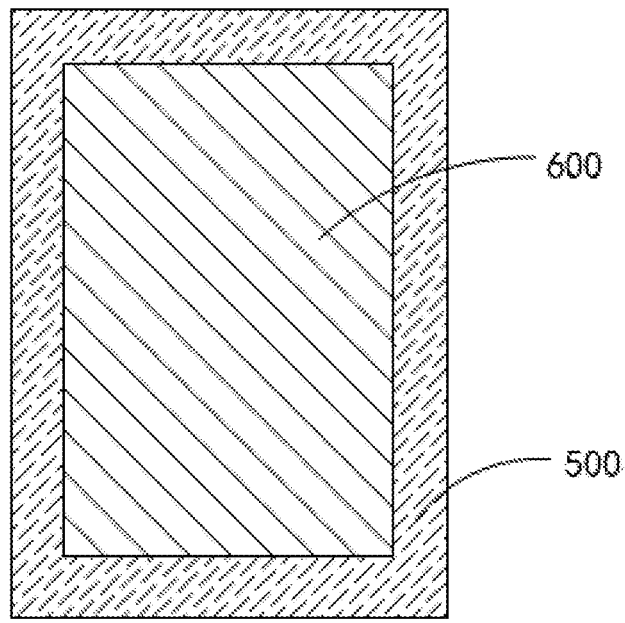
FIG. 6 is a schematic view illustrating a process of manufacturing a thin film encapsulation layer according to embodiment 1 of the present disclosure.

Refer to FIGS. 5 and 6, wherein FIG. 5 is a cross-sectional view of the first inorganic encapsulation layer in the process of manufacturing the thin film encapsulation layer of the embodiment, and FIG. 6 is a top view of the first inorganic encapsulation layer in the process of manufacturing the thin film encapsulation layer of the embodiment.

The step S30 includes following steps.

Step S301 of attaching a first precursor to a surface of the substrate is provided.

The first precursor is water vapor, and the water vapor is pulsed into a vacuum reaction chamber, such that the water vapor reaches the surface of the substrate. Since the barrier layer 500 has hydrophobicity, and a hydrophilic group such as hydroxide is present on the surface of the substrate not covered by the barrier layer 500, the water vapor does not effectively adhere to the surface of the barrier layer 500, but only attached to a closed structure formed by the barrier layer 500.

Step S302 of purging the surface of the substrate with an inert gas or nitrogen is provided.

By purging the surface of the substrate with an inert gas or nitrogen, the water vapor on the surface of the barrier layer 500 can be carried away by the inert gas or nitrogen gas, and the water vapor in a set region is not carried away.

Step S303 of attaching a second precursor to the surface of the substrate, such that the first precursor and the second precursor react to form a thin film layer is provided.

The second precursor is trimethylaluminum, and the trimethylaluminum is introduced into the vacuum reaction chamber in another pulse form, such that the trimethylaluminum reaches the surface of the substrate to perform a chemisorption reaction with the water vapor to form aluminum oxide. A film is formed in the closed structure formed by the barrier layer, that is, a film is formed in the set region.

Step S304 of purging the surface of the substrate with the inert gas or the nitrogen is provided.

The purge is to remove the trimethylaluminum on the surface of the substrate.

Step S305 of repeating the steps S301 to S303 to form the first inorganic encapsulation layer 600 having a predetermined thickness on the surface of the substrate is provided.

Alternately repeating the first precursor and the second precursor in a pulse form, such that a plurality of chemical adsorption reactions are performed on the surface of the substrate to obtain the first inorganic encapsulating layer with a desired thickness. In the embodiment, the first inorganic encapsulation layer 600 is a film of aluminum oxide.

The first precursor and the second precursor may also be other gases. Correspondingly, the first inorganic encapsulation layer may also be other materials such as zinc oxide.

Step S40 of removing the barrier layer is provided.

Figure 7:
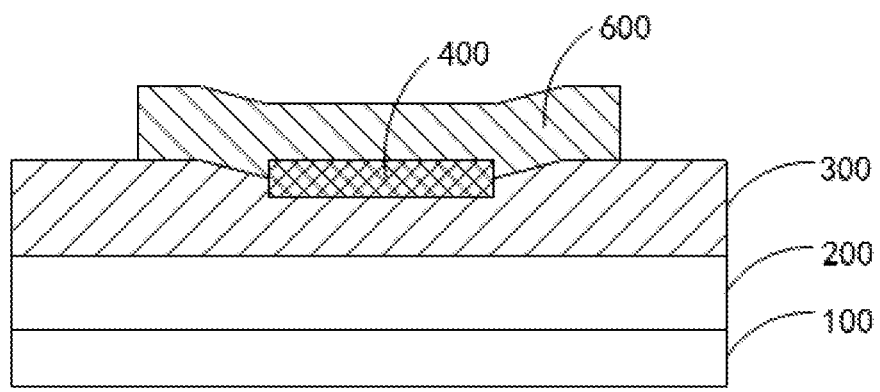
FIG. 7 is a schematic view illustrating a process of manufacturing a thin film encapsulation layer according to embodiment 1 of the present disclosure.
Figure 8:
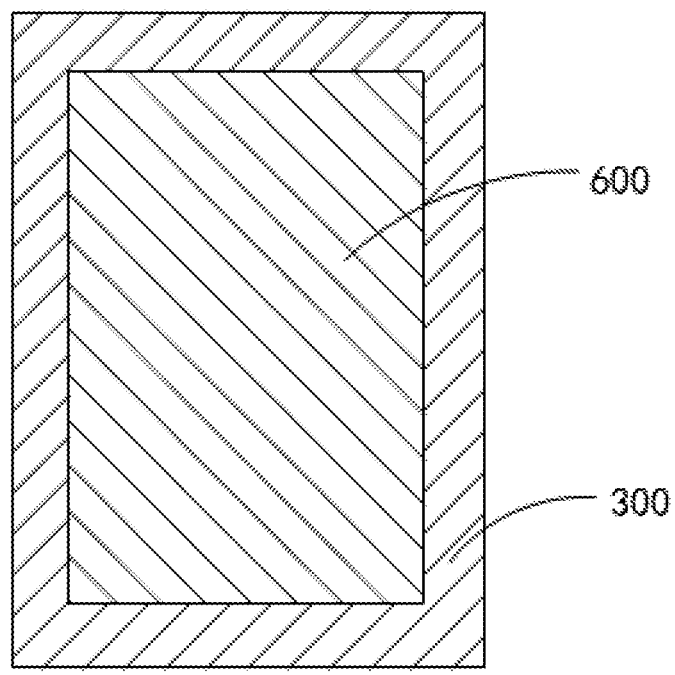
FIG. 8 is a schematic view illustrating a process of manufacturing a thin film encapsulation layer according to embodiment 1 of the present disclosure.

Refer to FIGS. 7 and 8, wherein FIG. 7 is a cross-sectional view of the thin film encapsulation layer after removing the barrier layer according to the embodiment, and FIG. 8 is a top view of the thin film encapsulation layer after removing the barrier layer according to the embodiment.

In the embodiment, the barrier layer 500 is surface-treated using an atmospheric pressure plasma cleaning machine. First, gas is activated using plasma, and then reacted with the barrier layer 500 using oxygen atoms and ozone, and after vacuuming, the barrier layer 500 is removed.

Plasma cleaning generally uses laser, microwave, thermal ionization, etc. to excite some non-polymerizable inorganic gases (such as argon, nitrogen, hydrogen, and oxygen) at high frequencies to produce a variety of active particles containing ions, excited molecules, free radicals, etc.

Principle of plasma generation is to apply a radio frequency voltage (frequency is about several tens of megahertz) to a group of electrodes, and a high-frequency alternating electric field is formed between the electrodes, and gas in a region generates a plasma under excitation of an alternating electric field. Active plasma acts on both of surface physical bombardment and chemical reaction to an object to be cleaned, such that surface material of the object to be cleaned becomes particles and gaseous substances, and is evacuated to achieve purpose of cleaning.

Material of the first inorganic encapsulating layer 600 is inorganic, and is not affected by plasma cleaning, and can effectively protect the OLED light emitting device. Material of the barrier layer 500 is organic, and a thickness of the barrier layer 500 is extremely thin, and can be removed using a plasma cleaning machine.

In other embodiments, the barrier layer 500 may also be removed using an organic solution or an acidic solution.

The substrate formed with the first inorganic encapsulation layer is placed in an organic solution for cleaning, and the barrier layer 500 is removed.

According to principle of similar solubility, the barrier layer 500 can be dissolved by an organic solution, and material of the first inorganic encapsulation layer 600 is aluminum oxide, and the aluminum oxide is a metal oxide, which is not affected by the organic solution.

Step S50 of forming an organic encapsulation layer on a surface of the first inorganic encapsulation layer is provided.

The organic encapsulation layer 700 can be formed using a photomask process.

Step S60 of forming a second inorganic encapsulation layer on a surface of the organic encapsulation layer, wherein the second inorganic encapsulation layer covers the first inorganic encapsulation layer and the organic encapsulation layer is provided.

Figure 9:
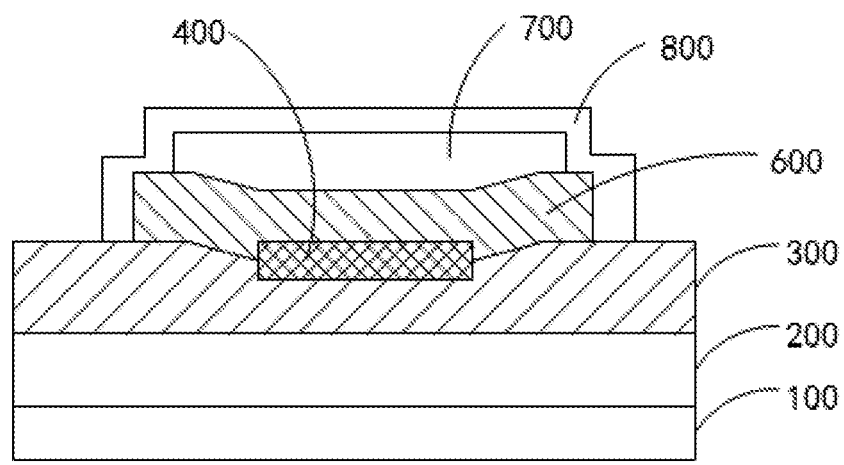
FIG. 9 is a schematic view illustrating a process of manufacturing a thin film encapsulation layer according to embodiment 1 of the present disclosure.

Refer to FIG. 9, a schematic structural view of a completed thin film encapsulation layer according to the embodiment is provided.

The method of manufacturing the second inorganic encapsulation layer 800 can be obtained by referring to the method of manufacturing the first inorganic encapsulation layer 600.

The present disclosure also provides an OLED display device including a substrate provided with an OLED light emitting device and a thin film encapsulation layer formed on the substrate using the above method.

The present disclosure has beneficial effects that the inorganic film layer deposited in the designated area by providing the barrier layer, thereby avoiding the use of the photomask process and saving cost.

The above descriptions are merely preferred implementations of the present disclosure, it should be noted that those of ordinary skill in the art can make a variety of improvements and substitutions on the premise of not deviating from the technical principle of the present disclosure, and these improvements and substitutions should be encompassed within the protection scope of the present disclosure.

The invention claimed is:

1. A method of manufacturing a thin film encapsulation layer, comprising:
   a step S10 of providing a substrate provided with an organic light emitting diode (OLED) light emitting device;
   a step S20 of forming a barrier layer on the substrate, wherein the barrier layer surrounds the OLED light emitting device and comprises an organic material having hydrophobic properties;
   a step S30 of forming a first inorganic encapsulation layer on the substrate, wherein the first encapsulation layer covers the OLED light emitting device;
   a step S40 of removing the barrier layer;
   a step S50 of forming an organic encapsulation layer on a surface of the first inorganic encapsulation layer; and
   a step S60 of forming a second inorganic encapsulation layer on a surface of the organic encapsulation layer, wherein the second inorganic encapsulation layer covers the first inorganic encapsulation layer and the organic encapsulation layers;
   before the step S30, performing a hydrophobic plasma treatment to a surface of the barrier layer for enhancing hydrophobic properties of the barrier layer.

2. The method of manufacturing the thin film encapsulation layer according to claim 1, wherein the step S40 comprises: cleaning the substrate provided with the first inorganic encapsulation layer using a plasma cleaning machine to remove the barrier layer.

3. The method of manufacturing the thin film encapsulation layer according to claim 1, wherein the step S40 comprises: cleaning the substrate provided with the first inorganic encapsulation layer using an organic solution or an acidic solution to remove the barrier layer.

4. The method of manufacturing the thin film encapsulation layer according to claim 1, wherein a thickness of the barrier layer is less than 2 μm.

5. The method of manufacturing the thin film encapsulation layer according to claim 1, wherein the barrier layer is made using a screen printing or a spot coating process.

6. The method of manufacturing the thin film encapsulation layer according to claim 1, wherein the step S30 comprises:
   a step S301 of attaching a first precursor to a surface of the substrate;
   a step S302 of purging the surface of the substrate with an inert gas or nitrogen;
   a step S303 of attaching a second precursor to the surface of the substrate, such that the first precursor and the second precursor react to form a thin film layer;
   a step S304 of purging the surface of the substrate with the inert gas or the nitrogen; and
   a step S305 of repeating the steps S301 to S303 to form the first inorganic encapsulation layer having a predetermined thickness on the surface of the substrate.

7. The method of manufacturing the thin film encapsulation layer according to claim 6, wherein the first precursor is water vapor, and the second precursor is trimethylaluminum.

8. A method of manufacturing a thin film encapsulation layer, comprising:
   a step S10 of providing a substrate provided with an organic light emitting diode (OLED) light emitting device;
   a step S20 of forming a barrier layer on the substrate, wherein the barrier layer surrounds the OLED light emitting device and comprises an organic material having hydrophobic properties;
   a step S30 of forming a first inorganic encapsulation layer on the substrate, wherein the first encapsulation layer covers the OLED light emitting device; and
   a step S40 of removing the barrier layer;
   before the step S30, performing a hydrophobic plasma treatment to a surface of the barrier layer for enhancing hydrophobic properties of the barrier layer.

9. The method of manufacturing the thin film encapsulation layer according to claim 8, wherein the step S40 comprises: cleaning the substrate provided with the first inorganic encapsulation layer using a plasma cleaning machine to remove the barrier layer.

10. The method of manufacturing the thin film encapsulation layer according to claim 8, wherein the step S40 comprises: cleaning the substrate provided with the first inorganic encapsulation layer using an organic solution or an acidic solution to remove the barrier layer.

11. The method of manufacturing the thin film encapsulation layer according to claim 8, wherein a thickness of the barrier layer is less than 2 μm.

12. The method of manufacturing the thin film encapsulation layer according to claim 8, wherein the barrier layer is made using a screen printing or a spot coating process.

13. The method of manufacturing the thin film encapsulation layer according to claim 8, wherein the step S30 comprises:
a step S301 of attaching a first precursor to a surface of the substrate;
a step S302 of purging the surface of the substrate with an inert gas or nitrogen;
a step S303 of attaching a second precursor to the surface of the substrate, such that the first precursor and the second precursor react to form a thin film layer;
a step S304 of purging the surface of the substrate with the inert gas or the nitrogen; and
a step S305 of repeating the steps S301 to S303 to form the first inorganic encapsulation layer having a predetermined thickness on the surface of the substrate.

14. The method of manufacturing the thin film encapsulation layer according to claim 13, wherein the first precursor is water vapor, and the second precursor is trimethylaluminum.

15. A method of manufacturing a thin film encapsulation layer, comprising:
a step S10 of providing a substrate provided with an organic light emitting diode (OLED) light emitting device;
a step S20 of forming a barrier layer on the substrate, wherein the barrier layer surrounds the OLED light emitting device and comprises an organic material having hydrophobic properties;
a step S30 of forming a first inorganic encapsulation layer on the substrate, wherein the first encapsulation layer covers the OLED light emitting device; and
a step S40 of removing the barrier layer;
wherein the step S30 comprises:
a step S301 of attaching a first precursor to a surface of the substrate;
a step S302 of purging the surface of the substrate with an inert gas or nitrogen;
a step S303 of attaching a second precursor to the surface of the substrate, such that the first precursor and the second precursor react to form a thin film layer;
a step S304 of purging the surface of the substrate with the inert gas or the nitrogen; and
a step S305 of repeating the steps S301 to S303 to form the first inorganic encapsulation layer having a predetermined thickness on the surface of the substrate.

16. The method of manufacturing the thin film encapsulation layer according to claim 15, further comprising, before the step S30, performing a hydrophobic plasma treatment to a surface of the barrier layer for enhancing hydrophobic properties of the barrier layer.

17. The method of manufacturing the thin film encapsulation layer according to claim 15, wherein the step S40 comprises: cleaning the substrate provided with the first inorganic encapsulation layer using a plasma cleaning machine to remove the barrier layer.

18. The method of manufacturing the thin film encapsulation layer according to claim 15, wherein the step S40 comprises: cleaning the substrate provided with the first inorganic encapsulation layer using an organic solution or an acidic solution to remove the barrier layer.

19. The method of manufacturing the thin film encapsulation layer according to claim 15, wherein a thickness of the barrier layer is less than 2 μm.

20. The method of manufacturing the thin film encapsulation layer according to claim 15, wherein the barrier layer is made using a screen printing or a spot coating process.

* * * * *